US010777381B1

(12) United States Patent
Kalinin et al.

(10) Patent No.: US 10,777,381 B1
(45) Date of Patent: Sep. 15, 2020

(54) BEAM CONTROLLED NANO-ROBOTIC DEVICE (71) Applicant: UT-Battelle, LLC, Oak Ridge, TN (US)

(72) Inventors: Sergei V. Kalinin, Oak Ridge, TN (US); Stephen Jesse, Oak Ridge, TN (US); Ondrej E. Dyck, Oak Ridge, TN (US); Bobby G. Sumpter, Oak Ridge, TN (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 0 days.

(21) Appl. No.: 16/536,037

(22) Filed: Aug. 8, 2019

(51) Int. Cl.
*G01Q 60/16* (2010.01)
*G01Q 70/12* (2010.01)
*H01J 37/26* (2006.01)
*B82B 3/00* (2006.01)
*H01J 37/317* (2006.01)
*H01J 37/28* (2006.01)
*B82Y 15/00* (2011.01)
*B82Y 40/00* (2011.01)

(52) U.S. Cl.
CPC .......... *H01J 37/265* (2013.01); *B82B 3/0076* (2013.01); *H01J 37/28* (2013.01); *H01J 37/317* (2013.01); *B82Y 15/00* (2013.01); *B82Y 40/00* (2013.01)

(58) Field of Classification Search
CPC .............. B22F 1/0018; B22F 1/0025; C12Q 2563/157; B82Y 30/00; B82Y 15/00; B82Y 40/00; B01D 2325/26; B01D 71/022; G01Q 60/16; G01Q 70/12; G01Q 70/14

USPC ............... 250/306; 850/43; 977/700, 902
See application file for complete search history.

(56) References Cited

U.S. PATENT DOCUMENTS

| | | | | |
|---|---|---|---|---|
| 9,580,834 B2* | 2/2017 | Najmaei | ............... | C30B 25/10 |
| 9,796,749 B2* | 10/2017 | Yin | ............... | C12Q 1/68 |
| 9,975,916 B2* | 5/2018 | Yin | ............... | C12N 15/10 |
| 10,099,920 B2* | 10/2018 | Shen | ............... | B82B 3/0047 |
| 2003/0135971 A1* | 7/2003 | Liberman | ............... | B01D 67/0058 |
| | | | | 29/419.1 |
| 2007/0194225 A1* | 8/2007 | Zorn | ............... | G01Q 60/12 |
| | | | | 250/306 |

(Continued)

OTHER PUBLICATIONS

Eigler, D.M. et al., "Positioning single atoms with a scanning tunnelling microscope," Nature, vol. 344, Apr. 5, 1990, pp. 524-526 (3 pages).

(Continued)

*Primary Examiner* — David A Vanore
(74) *Attorney, Agent, or Firm* — Lempia Summerfield Katz LLC (57) ABSTRACT

A system and method (referred to as a method) to fabricate nanorobots. The method generates a pixel map of an atomic object and identifies portions of the atomic object that form a nanorobot. The method stores those identifications in a memory. The method adjusts an electron beam to a noninvasive operating level and images the portions of the atomic object that form the nanorobot. The method executes a plurality of scanning profiles by the electron beam to form the nanorobot and detects nanorobot characteristics and their surroundings via the electron beam in response to executing the plurality of scanning profiles.

20 Claims, 7 Drawing Sheets

(56) References Cited

U.S. PATENT DOCUMENTS

2008/0236682 A1* 10/2008 Solomon ................ H01L 31/04
 137/560
2014/0041085 A1* 2/2014 Kalinin ................ G01Q 60/30
 850/43

OTHER PUBLICATIONS

Garcia, R. et al., "Advanced scanning probe lithography," Nature Nanotechnology 9, (2014), pp. 577-587 (27 pages).
Campos-Delgado, J. et al., "Iron Particle Nanodrilling of Few Layer Graphene at Low Electron Beam Accelerating Voltages," Part. Part. Syst. Charact., 30, 2013, pp. 76-82 (7 pages).
Kalinin, S.V. et al., "Fire up the atom forge-Rethink electron microscopy to build quantum materials from scratch," Nature, vol. 539, Nov. 24, 2016, pp. 485-487 (3 pages).
Dyck, O. et al., "Placing single atoms in graphene with a scanning transmission electron microscope," Appl. Phys. Lett, 11, 113104-1-113104-5, 2017 (6 pages).
Dyck, O. et al., "E-beam manipulation of Si atoms on graphene edges with an aberration-corrected scanning transmission electron microscope," Nano Research, 11(12), 2018, pp. 6217-6226 (10 pages).
Dyck, O. et al., "Building Structures Atom by Atom via Electron Beam Manipulation," Small, 14, 2018, 1801771 (9 pages).

* cited by examiner

BEAM CONTROLLED NANO-ROBOTIC DEVICE

STATEMENT REGARDING FEDERALLY SPONSORED RESEARCH AND DEVELOPMENT

These inventions were made with United States government support under Contract No. DE-AC05-00OR22725 awarded by the United States Department of Energy. The United States government has certain rights in the inventions.

BACKGROUND OF THE DISCLOSURE

1. Technical Field

This application relates to three-dimensional nanofabrication processes and specifically to atom-level robotic assembly and control.

2. Related Art

The fabrication of devices below the micron level is subject to progressive fabrication and operating limits. Some approaches are restricted by synthesis and others by assembly and both are challenging to program. Some systems cannot communicate with other systems or apply swarm intelligence.

A significant challenge to building molecular level robotic technologies is the difficulty integrating and powering dissimilar functionalities in very small devices. Even in biological systems refined by over a billion years of evolution, size reductions typically eliminate higher control functions forcing smaller devices to become essentially hard-wired. These systems are difficult to control and typically require physical contact to initiate movement. As a result, the processes render devices that have extremely narrow functionalities.

BRIEF DESCRIPTION OF THE DRAWINGS

The disclosure is better understood with reference to the following drawings and description. The elements in the figures are not necessarily to scale, emphasis instead being placed upon illustrating the principles of the disclosure. Moreover, in the figures, like-referenced numerals designate corresponding parts throughout the different views.

DETAILED DESCRIPTION

In this disclosure, a nanorobot is an extremely small machine designed to perform specific tasks repeatedly and with precision at atomic dimensions of a single atom or a small atomic group on a scale from about 0.1 to about 0.5 nanometers in length and/or any value, values, or ranges that lie therebetween. Nanorobotic devices are capable of manipulating matter on molecular and atomic scales. The small-scale robots (e.g., that may comprise a single atom or a small atomic group) can operate in liquid and non-vacuum environments. The nanorobotic devices can be directly and indirectly controlled through a wireless media. A collimated stream of electrons, for example, may be used to power the nanorobotic devices, provide control instructions, and render feedback used to automatically monitor and automatically control the movement and operation of the devices through a remote image processing. In some systems, collimated streams and/or scanning streams of electrons of less than an angstrom construct and/or modify nanorobotic devices in atomically confined volumes, such as in the areas that the nanorobotic devices operate. In one use case, fabrications included inducing hole formations in specimens (e.g., a few atoms wide) through a non-contact collimated electron beam (e.g., a wireless medium) that was also used to control the nanorobotic devices and induce their movements. The holes were formed in the thin films of the nanorobots, with some having exceptional electronic and optoelectronic properties (e.g., made in a monolayer molybdenum disulfide (MoS2) and molybdenum diselenide (MoSe2)). Conductive crystalline MoS and MoSe nanowires were thereafter formed therebetween that enabled electronic and optoelectronic communication.

Figure 1:
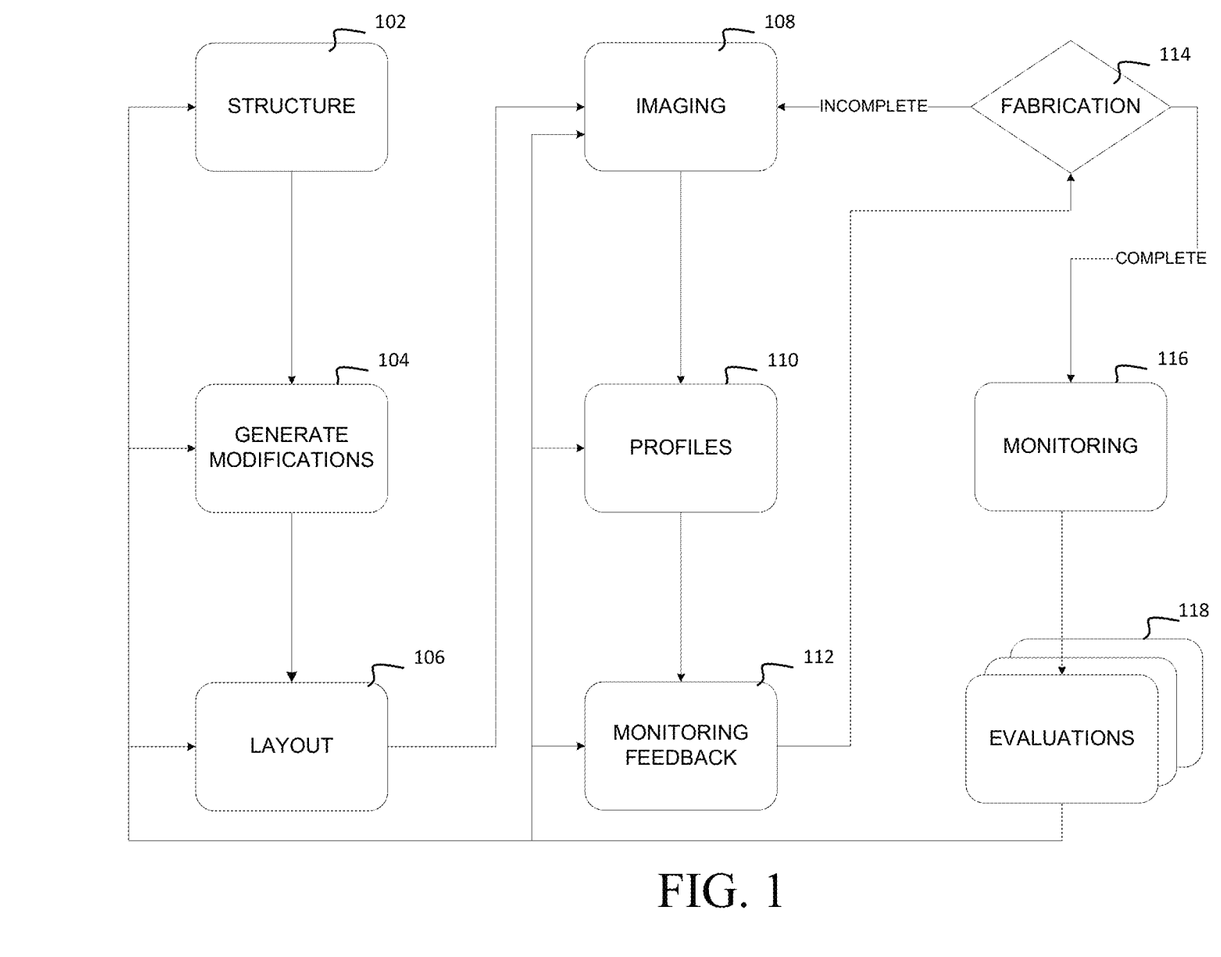
FIG. 1 is a process that assembles, controls, and directs movement of one or more nanorobotic devices.

FIG. 1 shows a process that fabricates one or more nanorobotic devices. The fabrication may occur on the site the nanorobotic devices operate on/in or are remotely made and later launched. At optional 102, a pixel map of an atomic object is captured through pixel map generator 706 (shown in FIG. 7). A pixel map is a data structure that describes one or more-pixel images of an atomic object, which identifies the local crystallographic structure, surface topography, distribution of vacancies, and/or dopant atoms, and/or other features of interest that may be rendered by a scanning transmission electronic microscope (STEM). The pixel maps may include multiple images of the atomic object, feature alignments, etc., that in some systems are integrated to form a virtual reality (VR), an augmented reality (AR), or mixed reality representations (e.g., elements of both VR and AR) of the atomic object that can be modified and/or further processed into a nanorobot.

At optional 104, macroscopic modifications are made to the atomic object to prepare the fabrication. The modification may include depositions, cleaning, integrations, etc. In some exemplary use cases, macroscopic contacts were formed on the atomic objects through electron beam processing and lithography. Other modifications can be made by cleaning, heating, electron beam irradiation, light irradiation, and/or ion irradiation, and/or others can be made via depositions deposited through evaporation processes that collectively may be generated via a macroscopic modifier 708 (shown in FIG. 7).

At 106, portions of the atomic object that form or may be used to form the nanorobot are identified and stored in memory. The nanorobot may comprise a single atom, an atomic cluster, or a more complex assembly. The identifications identify molecular blocks that are capable of executing precise functionalities, (e.g., like a robotic arm movements), identify synthetic pathway, and/or identify the operational atomic structures that form the nanorobot through computational methods, reaction databases, graphical search algorithms and/or electron scans.

At 108, non-invasive (e.g. enabled through a low energy dose, compressed sensing, or more complex image-recognitions) imaging is executed. In an exemplary use case, a STEM captures and stores portions of the atomic object that form the nanorobot and its surroundings automatically at an adjusted or reduced power level. The term "non-invasive" and "noninvasive operating level" means that electron beam energy or current is adjusted to a level that does not invade the nanorobotic parts, impart energy to them, and/or cause their movement. A "non-invasive" and "noninvasive operating level" is a beam energy level or current level that is below a threshold that causes damage. In some use cases, the electron beam was generated by a sub-angstrom machine or non-invasive imager 710 (shown in FIG. 7), so that the electron beam was focused to less than an angstrom (e.g., about an 0.8 of an Angstrom or less).

At 110, the electron beam automatically executes scanning profiles 712 (shown in FIG. 7) that assemble and/or form the nanorobots by designating predefined locations and temporal scanning patterns executed at predetermined trajectories. The scanning profiles 712 accessed from memory may distribute higher and variable energy levels across an adjustable field of view through any desired scanning pattern, rather than just a linear scan or a raster scan. Some scans wind around a fixed center point such as a portion of the nanorobot parts or about them, some move or rotate with an uneven or rocking motion in coordinate (e.g., X and Y) directions from side-to-side about select nanorobot parts or portions of them, and some adjust the focal depth of the electron beam, allowing the scans to focus energy on the select nanorobotic part and/or selected portions of its surroundings especially when the desired target is not positioned on an exposed surface. Each scan or a combination of scans can adjust the energy levels that are needed to form and/or assemble the nanorobots without causing damage.

Figure 7:
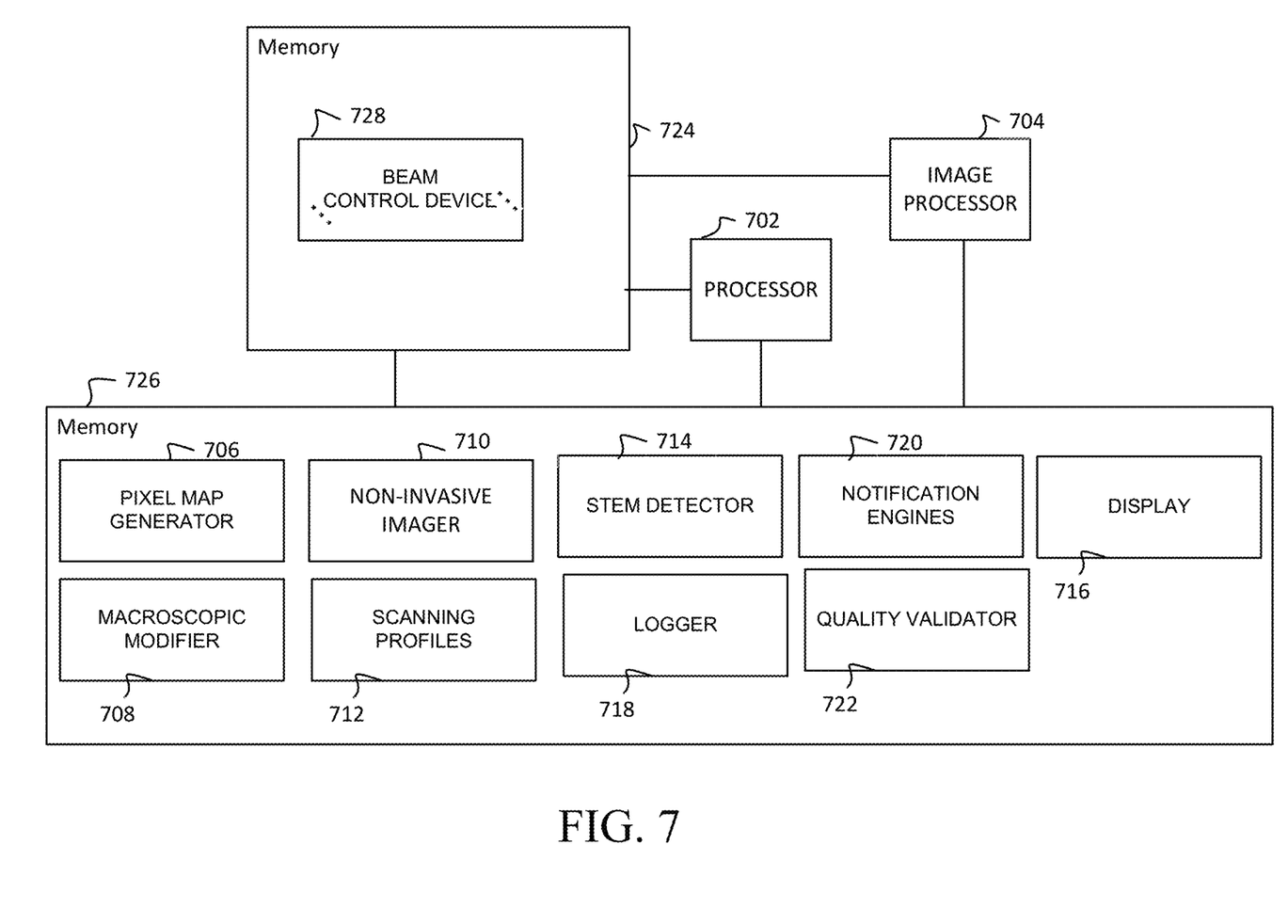
FIG. 7 is an exemplary fabrication and control system.

At 112, the diffraction patterns are detected, received, and transformed into representations of the nanorobot formations/assemblies/characteristics and/or their surroundings via a STEM detector 714 (shown in FIG. 7). The received signals may include but are not limited to measures of scalar intensity on bright and dark field detectors, ptychographic diffraction patterns, and/or electron energy loss spectra. These signals can be reconstructed to capture the temporal movement and changes in the nanorobot formation and its parts. The signals may also render sub-images that reveal their movement, vibrations, resonance, etc. In some processes, the stored signals are combined with real-time images, which combines AR with VR, which show how real-world physical nanorobotic formations and/or assemblies interact with digital representations of their surroundings that co-exist and interact in real-time that may be amplified and rendered via an image processor 704 on a computer display 716. In an alternate use case, real-time images of the soundings are combined with digital representations of the actual nanorobotic parts to visualize the environments and show how the nanorobots are formed or assembled within its surroundings in real-time via a second perspective via the image processor 704. In another alternate use case, the processes generate one or more immersive renderings that captures the enveloping fabrication and its surroundings via sight, sound (e.g., translated to an aural range), and touch (e.g., translated into a detectable tactile response) via the image processor 704. A real-time operation is a process that occurs at the same rate as data is received, enabling the direct control of a fabrication process as the fabrication process occurs.

In response to the detection, the process repeats at 114 applying the same or different scanning profiles 712, until the desired nanorobot is fabricated. The desired nanorobot assembly or formation occurs through the execution of one or more scanning patterns at 110. Its development is monitored, tracked, and logged at 108 and/or 112 via a logging device 718. In some fabrications, the feedback modifies one or more scanning profiles 712 or initiates a selection of one or more other scanning profiles 712 that ensure compliance with predetermined tolerances and specifications predefined for the desired nanorobotic device. Once tolerances and specifications are met, an optional notification engine 720 may transmit an asynchronous alert that may interrupt a processing thread and cause the recipient device to execute an asynchronous procedure or deliver a message.

Once completed, the fabricated nanorobots are monitored and the fabrication processes logged at optional 116. The monitoring ensures that the nanorobots conform to pre-established standards (e.g., tolerances, specifications, etc.). Monitoring occurs via periodic, random, or continuous quality inspections. In some use cases, monitored images and meta data captured by an electron scan are stored in memory and compared to one or more baselines and/or models. Deviations are measured and correlated to the collected signals received at optional 112 via a quality validator 722 (shown in FIG. 7). Applying metrics, such as univariate and multivariate statistics, for example, one or more or all of the fabrication steps or scanning profiles that render the fabricated nanorobots are optimized and/or modified.

Movement of the nanorobots may be powered and controlled fully or partially by electron beams too. The oscillations generated by the electron beams can cause the nanorobots to move in a rocking motion along a linear path and can be used to alter the nanorobot's course and direct it to one or more targets.

Figure 2:
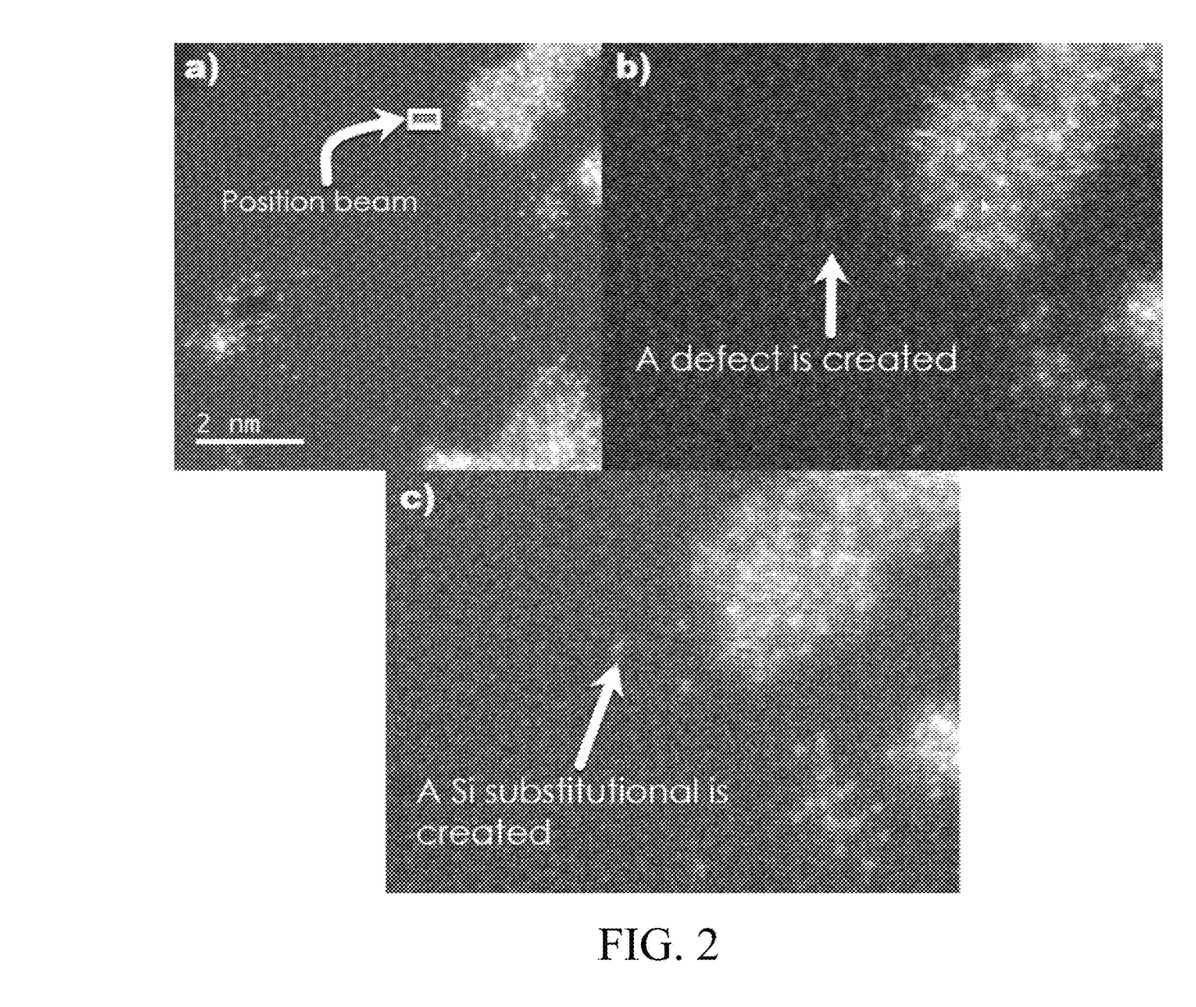
FIG. 2 is an exemplary sequence of an electron beam controlling atomic motion.

FIG. 2 illustrates images rendered by an exemplary electron beam controlling atomic motion. In FIG. 2*a*, a single layer of carbons atom is shown in a hexagonal lattice (e.g., graphene). With a target location selected, an electron beam of about 100 kV was applied which created a defect detected by the non-invasive imager 710 as shown in FIG. 2*b*. A source material was agitated by the electron beam that freed silicon and carbon, Si and C. In FIG. 2*c*, the electron beam promotes lattice healing as the source atoms moved into the defect region.

Figure 3:
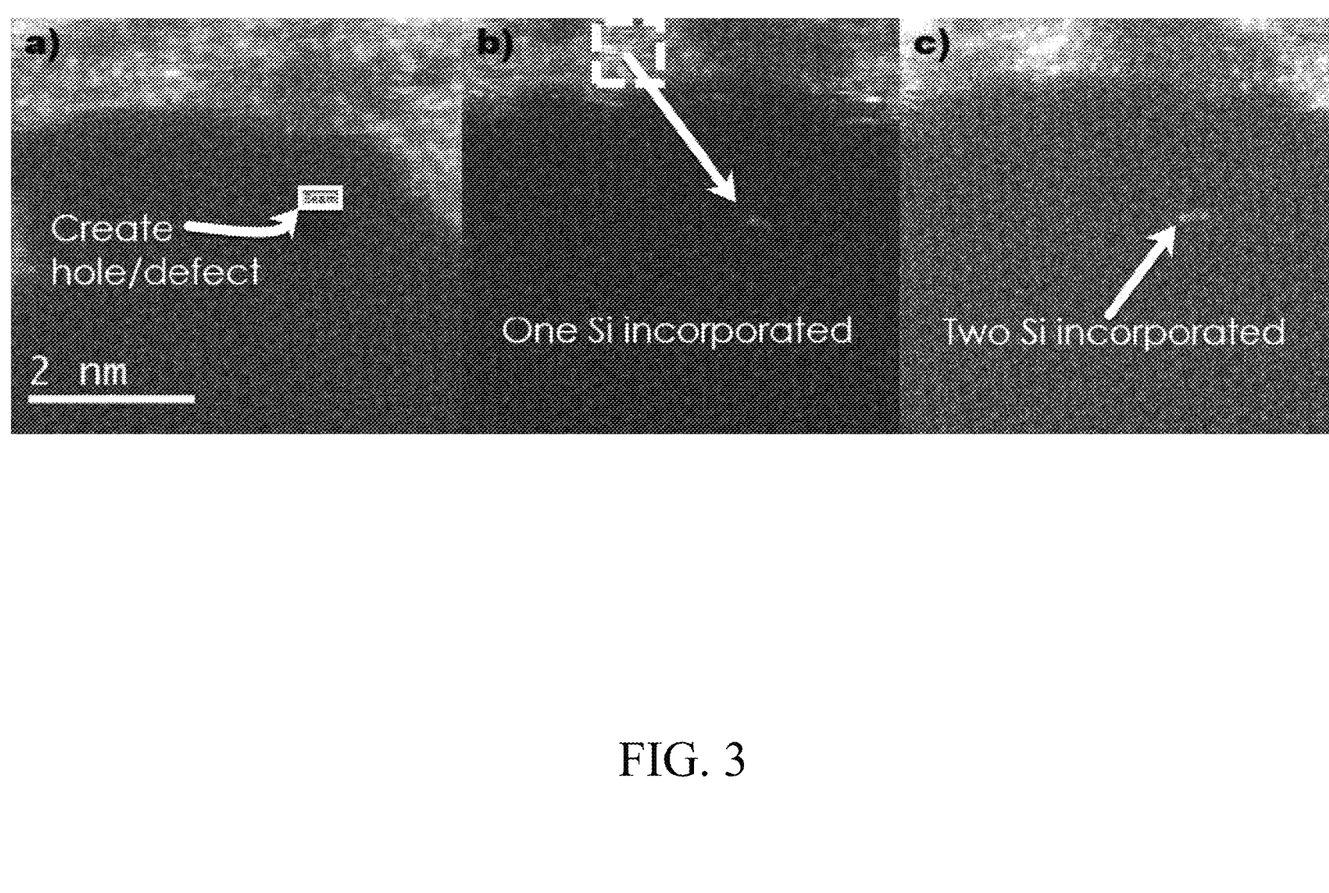
FIG. 3 is an exemplary sequence of an electron beam controlling another atomic motion.

FIG. 3 illustrates a process like FIG. 2 with the difference being the addition of two silicon atoms to the defect region. In FIG. 3*a*, a STEM created a hole in a hexagonal lattice (e.g., graphene). A source material was agitated with the electron beam, and the graphene was healed by the integration of two silicon atoms within the defect region as shown in FIGS. 3*b* and 3*c*.

Figure 4:
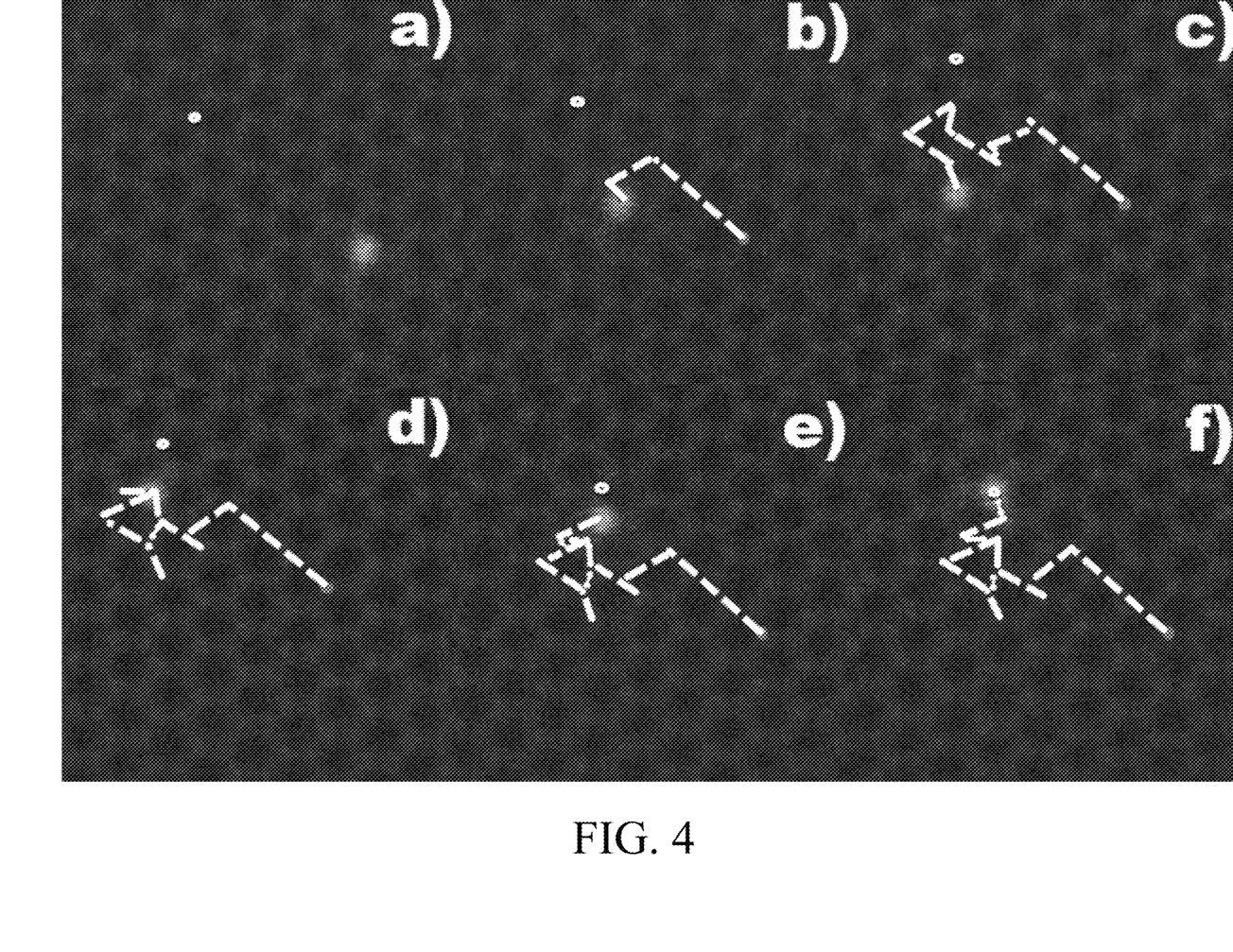
FIG. 4 illustrates the result of an exemplary electron beam controlling a single atom.

FIG. 4 illustrates images rendered by an exemplary control of a single atom within a graphene lattice. In FIG. 4, an electron beam of about 60 kV scanned over a sub-region of an atomic object which included a silicon atom and a neighboring atom. Periodically, the silicon atom exchanged lattice sites with a neighboring atom due to the beam irradiations. By scanning the beam over a neighboring atom, the silicon atom was directed to that lattice site. While in some use cases scanning was performed manually, in alternate use cases scanning is automatic. FIG. 4*a* shows the initial atomic configuration, with the dashed highlights identifying the navigational paths to the target location for a silicon atom, FIG. 4*b*-FIG. 4*f* show the silicon atom's progression through time.

Figure 5:
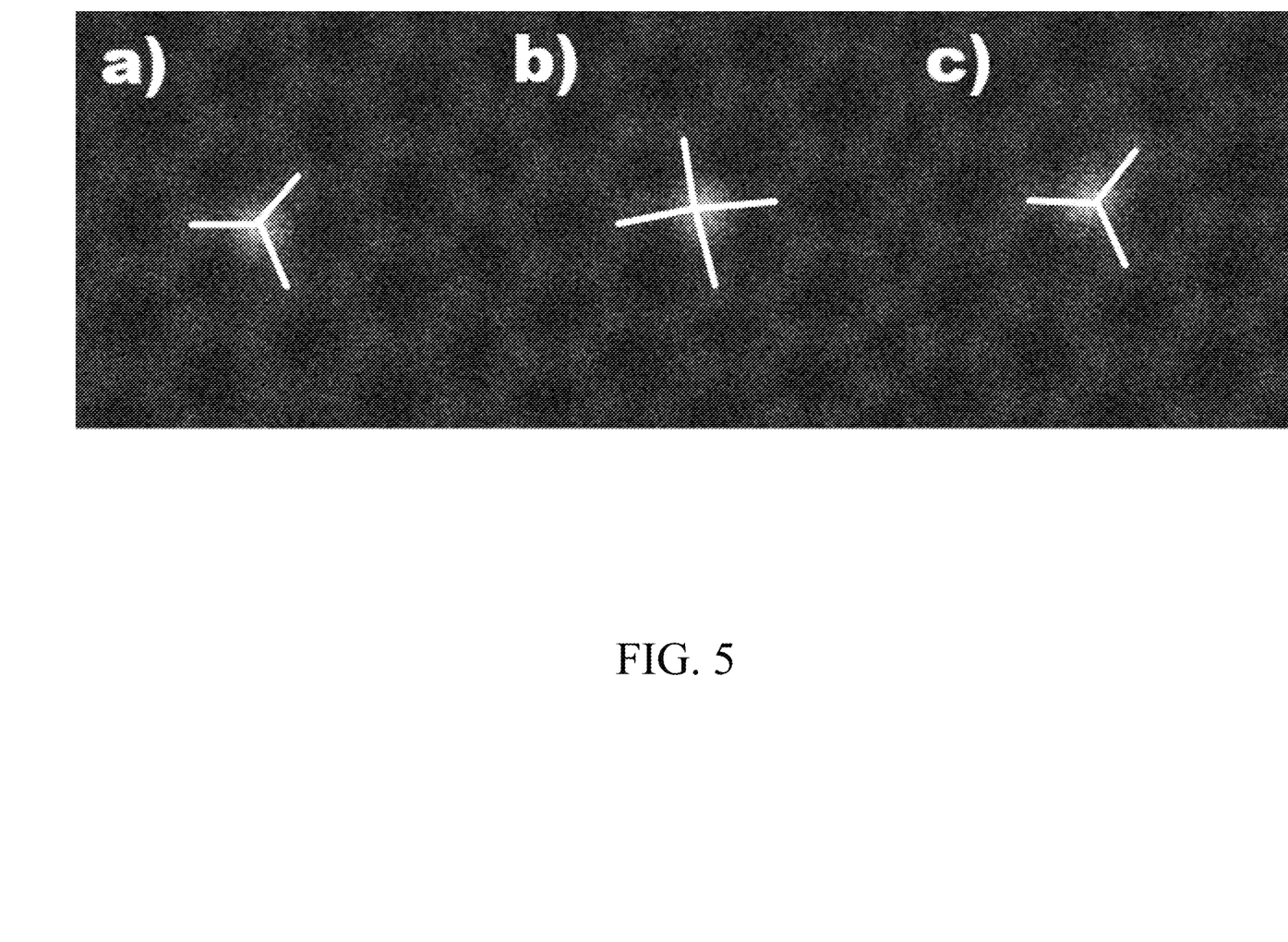
FIG. 5 illustrates the result of an exemplary manipulation of an atomic bonding.

FIG. 5 shows images rendered from an example manipulation of atomic bonding. FIG. 5a shows a three-fold coordinated silicon substitutional defect, with the linear highlights showing the bonds. The graphene lattice is missing a single carbon atom which is occupied by a silicon atom. Upon irradiating the silicon atom's nearest neighbors with about a 60 kV electron beam, another carbon atom is knocked free from the lattice and it restructures into a four-fold coordination where the silicon atom occupies two carbon lattice positions as shown in FIG. 5b. Continued irradiation of the neighbor atoms inspires a recapturing of a carbon atom and the structure is transformed back into the original configuration as shown in FIG. 5c.

Figure 6:
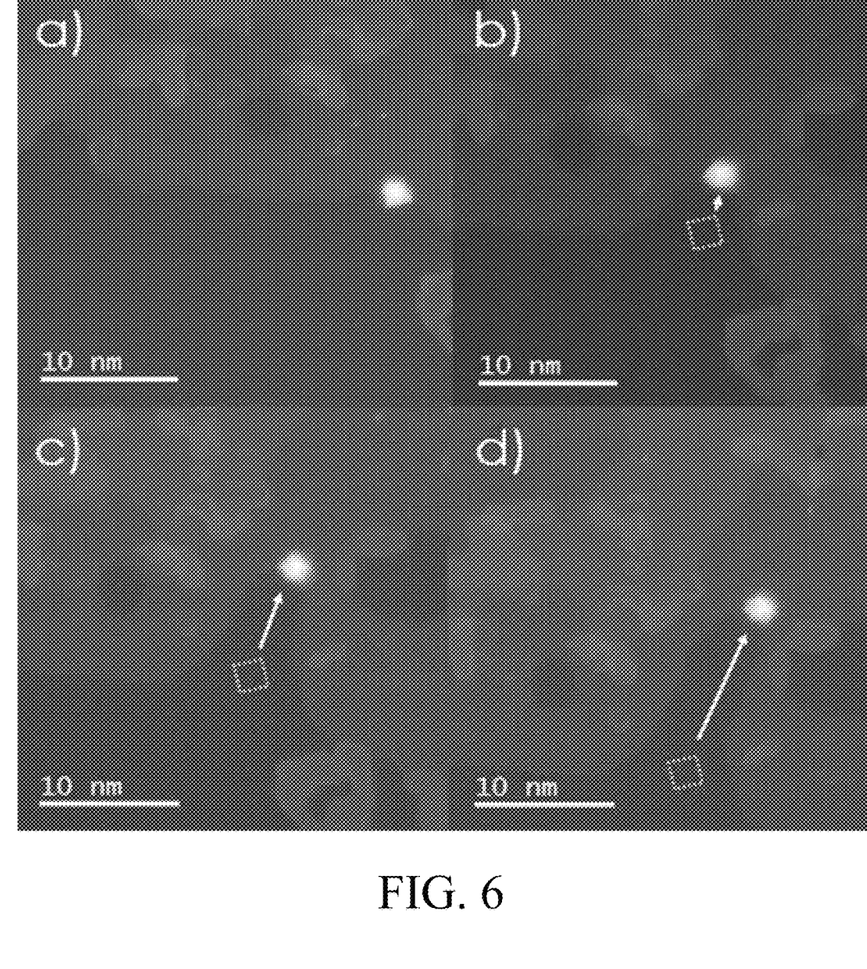
FIG. 6 illustrates a semi-controlled motion of a nanoparticle via an electron beam-induced etching.

FIG. 6, illustrates images rendered from a semi-controlled motion of a tungsten nanoparticle via an electron beam. As shown, a nanoparticle (bright object) is sitting atop a single layer of graphene attached to the edge of bilayer graphene. By scanning the electron beam across an area over the nanoparticle, a bilayer is cut away through an electron beam-induced chemical reaction with the tungsten nanoparticle without damaging the underlying surface. The nanoparticle remains attached to the edge of the receded bilayer graphene and was pulled over a distance of more than about 10 nm. This is an auto-controlled motion. The direction of motion was primarily directed by the particle's interaction with the bilayer. The motion was detected by the non-invasive imager 710. The evolution through time is shown in FIG. 6b-FIG. 6d. As shown, the evolution took approximately five minutes between each time frame (e.g., from a to b, from b to c, and from c to d).

FIG. 7 is a block diagram of a fully automated nanofabrication and control system that executes the process flows and characteristics described above and those shown in FIGS. 1-6 to fabricate, power, and control nanorobotic devices. The system comprises processors 702 and 704, a non-transitory computer readable medium such as a memory 724 and 726 (the contents of which are accessible to the processors 702 and 704), and an Input/output interface (I/O interface—not shown). The I/O interface connects devices and local and/or remote applications such as, for example, additional local and/or remote robotic specifications. The memory 724 and 726 stores instructions in a non-transitory media, which when executed by the processor or image processor 702 or 704, causes the nanorobotic fabrication and some or all of the functionality associated with fabricating and controlling nanorobotic devices, for example. The memory 724 and 726 stores software instructions, which when executed by one or both of the processors 702 and 704, causes the fabrication, powering, and/or control system to render functionality associated with the pixel map generator 706, the microscopic modifier 708, the non-invasive imager 710, the scanning profiles 712, the STEM detector 714, the log device 718, the notification engine 720 (generating a visual, textual, or auditory signal or control signal alerting a user to a completed fabrication or completion of a task), the quality validator 722, an electron beam control device 728 and the display 716. In yet another alternate nanofabrication and control system, the non-transitory media provided functionality is provided through cloud storage. In this nanofabrication and control system, cloud storage provides ubiquitous access to the system's resources and higher-level services that can be rapidly provisioned over a distributed network. Cloud storage allows for the sharing of resources to achieve consistent services across many monitored devices at many local and remote locations and provides economies of scale.

The memory 724 and 726 and/or storage disclosed may retain an ordered listing of executable instructions for implementing the functions described above in a non-transitory computer code. The machine-readable medium may selectively be, but not limited to, an electronic, a magnetic, an optical, an electromagnetic, an infrared, or a semiconductor medium. A non-exhaustive list of examples of a machine-readable medium includes: a portable magnetic or optical disk, a volatile memory, such as a Random-Access Memory (RAM), a Read-Only Memory (ROM), an Erasable Programmable Read-Only Memory (EPROM or Flash memory), or a database management system. The memory 724 and 726 may comprise a single device or multiple devices that may be disposed on one or more dedicated memory devices or disposed on a processor or other similar device. An "engine" comprises a hardware processor or a portion of a program executed by a processor that executes or supports nanorobotic fabrications, powering, and/or nanofabrication control. When functions, steps, etc. are said to be "responsive to" or occur "in response to" another function or step, etc., the functions or steps necessarily occur as a result of another function or step, etc. It is not sufficient that a function or act merely follow or occur subsequent to another. The term "substantially" or "about" encompasses a range that is largely (anywhere a range within or a discrete number within a range of ninety-five percent and one-hundred and five percent), but not necessarily wholly, that which is specified. It encompasses all but an insignificant amount.

The disclosed nanorobotic devices and processes are capable of manipulating matter on molecular and atomic scales. The disclosed small-scale robots (e.g., that may comprise a single atom or a small atomic group) can operate in liquid and non-vacuum environments. The nanorobotic devices can be directly and indirectly fabricated and controlled through collimated stream of electrons, for example. The electron beam may be used to control the position of the atomic object, induce reactions to form or assemble nanorobotic devices, power the nanorobotic devices, provide control instructions, and render feedback used to automatically monitor and control further movement and operation of the devices. The control may be facilitated via a local or a remote image processing. In some systems, a spatially localized scanning streams of electrons of less than an angstrom construct and/or modify nanorobotic devices in atomically confined volumes. In alternate systems, the electron beam and STEM were replaced by one or more photon and/or ion streams and one or more optical microscopes to render fabrications and/or nanorobotic control.

Other systems, methods, features and advantages will be, or will become, apparent to one with skill in the art upon examination of the figures and detailed description. It is intended that all such additional systems, methods, features and advantages be included within this description, be within the scope of the disclosure, and be protected by the following claims.

What is claimed is:

1. A method a fabricating a nanorobot comprising:
generating a pixel map of an atomic object;
identifying portions of the atomic object that form a nanorobot and storing those identification in a memory;
adjusting an electron beam to a noninvasive operating level and imaging the portions of the atomic object that form the nanorobot;
executing a plurality of scanning profiles by the electron beam to form the nanorobot; and detecting nanorobot characteristics and their surroundings via the electron beam in response to executing the plurality of scanning profiles.

2. The method of claim 1 where the atomic object comprises a single atom.

3. The method of claim 1 where the nanorobot is about 0.1 to about 0.5 nanometers in length.

4. The method of claim 1 where the pixel map comprises a data structure that describes one or more-pixel images of an atomic object and identifies a crystallographic structure, surface topography, and distribution of vacancies.

5. The method of claim 4 where the pixel map comprises the data structure that describes one or more-pixel images of the atomic object that identifies a plurality of dopant atoms.

6. The method of claim 1 further comprising modifying the atomic object before adjusting the electron beam to a noninvasive operating level.

7. The method of claim 6 where the modifying the atomic object comprises forming a plurality of macroscopic contacts on the atomic object.

8. The method of claim 1 further where the electron beam comprises a beam that is about an 0.8 of an Angstrom.

9. The method of claim 1 further where the electron beam comprises a beam that is less than about an 0.8 of an Angstrom.

10. The method of claim 1 where the executing of the scanning profiles comprises wind around a fixed center point of the atomic object that comprises such as a portion of a nanorobot part.

11. The method of claim 1 where the executing of the scanning profiles comprises winding the electron beam around a fixed center point of the atomic object that comprises such as a portion of a nanorobot part.

12. The method of claim 1 where the executing of the scanning profiles comprises rotating the electron beam with an uneven or rocking motion in an X coordinate and a Y coordinate direction.

13. The method of claim 1 where the executing of the scanning profiles comprises adjusting a focal depth of the electron beam so that the electron beam focuses energy on select nanorobot robotic parts below an exposed surface.

14. The method of claim 1 where the detecting nanorobot characteristics and their surroundings comprises integrating a plurality of images to form a virtual reality representation of the nanorobot in real-time.

15. The method of claim 1 where the detecting nanorobot characteristics and their surroundings comprises integrating a plurality of images to form an augmented reality representation of the nanorobot in real-time.

16. The method of claim 1 further comprising inducing robotic movement of the nanorobot via the electron beam.

17. The method of claim 1 further comprising inducing all robotic movement of the nanorobot via the electron beam.

18. A non-transitory computer-readable medium having stored thereon a plurality of software instructions that, when executed by a processor, causes:
generating a pixel map of an atomic object;
identifying portions of the atomic object that form a nanorobot and storing those identification in a memory;
adjusting an electron beam to a noninvasive operating level and imaging the portions of the atomic object that form the nanorobot;
executing a plurality of scanning profiles by the electron beam to form the nanorobot; and
detecting nanorobot characteristics and their surroundings via the electron beam in response to executing the plurality of scanning profiles.

19. The non-transitory computer-readable medium of claim 18 where the atomic object comprises a single atom.

20. The non-transitory computer-readable medium of claim 18 where the nanorobot is about 0.1 to about 0.5 nanometers in length.

* * * * *